(12) United States Patent
Eum et al.

(10) Patent No.: US 10,826,399 B2
(45) Date of Patent: Nov. 3, 2020

(54) SYSTEM AND METHOD FOR CONTROLLING OUTPUT SIGNAL OF POWER CONVERTER

(71) Applicant: SEMICONDUCTOR COMPONENTS INDUSTRIES, LLC, Phoenix, AZ (US)

(72) Inventors: Hyun-Chul Eum, Bucheon (KR); Tae-Sung Kim, Mokdongseo-ro (KR); Young-Mo Yang, Seoul (KR); Sung-Won Yun, Seoul (KR); Woo-Kang Jin, Bucheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/392,153

(22) Filed: Apr. 23, 2019

(65) Prior Publication Data

US 2019/0252984 A1     Aug. 15, 2019

Related U.S. Application Data

(63) Continuation of application No. 15/604,126, filed on May 24, 2017, now Pat. No. 10,291,130.
(Continued)

(51) Int. Cl.
*H02M 3/335* (2006.01)
*H05B 45/00* (2020.01)
(Continued)

(52) U.S. Cl.
CPC ........ *H02M 3/33507* (2013.01); *H02M 1/08* (2013.01); *H02M 1/32* (2013.01); *H02M 3/33515* (2013.01); *H03G 1/0088* (2013.01); *H05B 45/00* (2020.01); *H05B 45/10* (2020.01); *H05B 45/37* (2020.01); *H05B 45/395* (2020.01); *H05B 45/44* (2020.01); *H05B 45/48* (2020.01); *H05B 45/50* (2020.01); *H02M 2001/0009* (2013.01); *H02M 2003/1566* (2013.01)

(58) Field of Classification Search
CPC ................................................. H02M 3/33507
USPC ......... 363/21.12, 21.13, 21.15, 21.16, 21.17, 363/21.18
See application file for complete search history.

(56) References Cited

U.S. PATENT DOCUMENTS

2014/0320102 A1   10/2014   Ali et al.
2015/0340954 A1*  11/2015   Hu .................... H02M 3/33507
                                                              363/21.16

OTHER PUBLICATIONS

Fairchild Semiconductor, "FAN7930 Critical Conduction Mode PFC Controller," Mar. 2010.

* cited by examiner

*Primary Examiner* — Nguyen Tran
(74) *Attorney, Agent, or Firm* — AMPACC Law Group, PLLC

(57) ABSTRACT

A method includes generating a gain transition signal in response to any one of an average value of a feedback signal, a slope of the feedback signal, a slope of an input signal of the power converter, a maximum value of the input signal, and a minimum value of the input signal, and generating a first gain control signal and a second gain control signal in response to the gain transition signal. A gain transition controller includes a transition signal generator generating the gain transition signal and a gain control signal generator generating the first gain control signal and the second gain control signal in response to the gain transition signal.

20 Claims, 6 Drawing Sheets

Related U.S. Application Data

(60) Provisional application No. 62/344,780, filed on Jun. 2, 2016.

(51) Int. Cl.
*H05B 45/395* (2020.01)
*H05B 45/50* (2020.01)
*H05B 45/44* (2020.01)
*H05B 45/37* (2020.01)
*H05B 45/10* (2020.01)
*H05B 45/48* (2020.01)
*H02M 1/08* (2006.01)
*H03G 1/00* (2006.01)
*H02M 1/32* (2007.01)
*H02M 3/156* (2006.01)
*H02M 1/00* (2006.01)

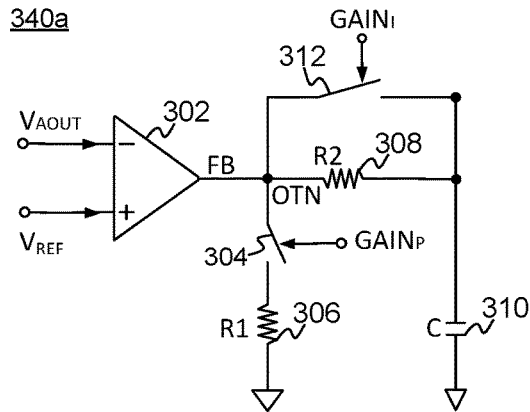
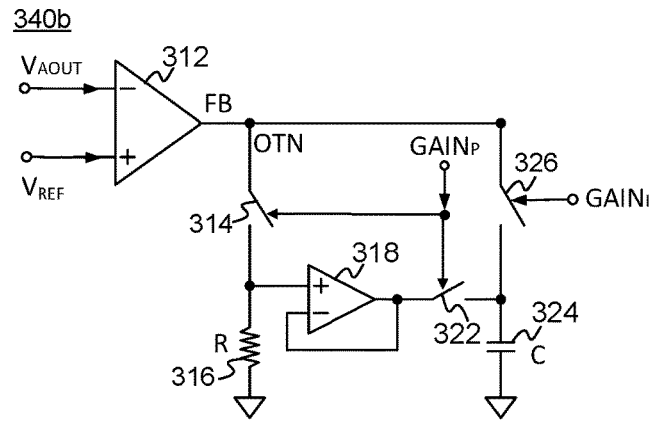
FIG. 3A
FIG. 3B
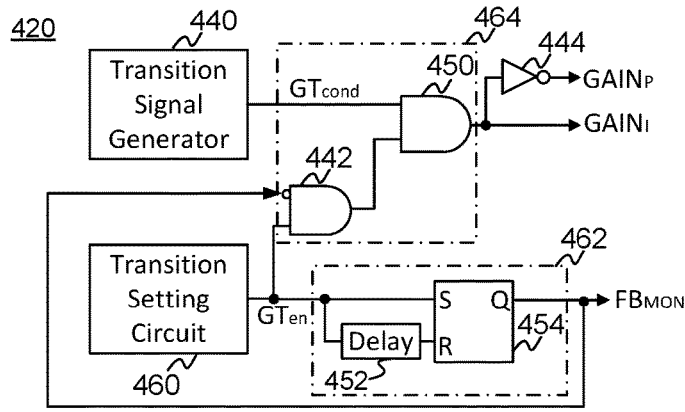
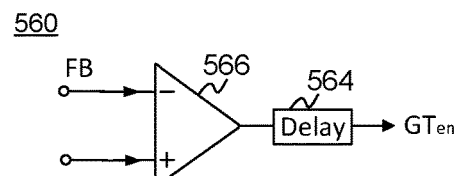
FIG. 4
FIG. 5
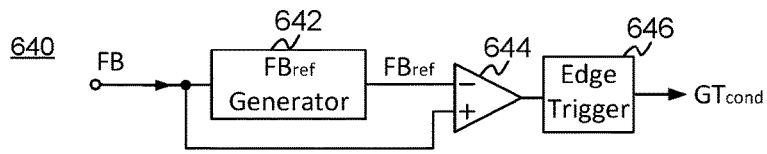
FIG. 6
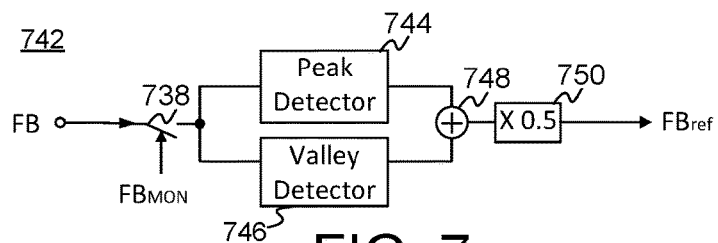
FIG. 7

SYSTEM AND METHOD FOR CONTROLLING OUTPUT SIGNAL OF POWER CONVERTER

CROSS-REFERENCE TO RELATED APPLICATION

This application is a Continuation of U.S. patent application Ser. No. 15/604,126 filed on May 24, 2017, which claims the benefit of U.S. Provisional Application No. 62/344,780 filed on Jun. 2, 2016, the entire contents of which are incorporated herein by reference.

BACKGROUND

This present disclosure relates to integrated circuit devices, and more particularly to a power converter.

A power converter converts an input voltage into an output voltage and provides the output voltage to a load. The power converter may regulate the output voltage at a substantially constant level using a feedback loop for power factor correction (PFC) control. However, in a startup operation, a relatively large capacitance of the feedback loop may lead to a slow increase of the output voltage.

BRIEF DESCRIPTION OF THE DRAWINGS

FIG. 3A illustrates a gain control circuit suitable for use as a gain control circuit of FIG. 2 according to an embodiment.

FIG. 3B illustrates a gain control circuit suitable for use as the gain control circuit of FIG. 2 according to another embodiment.

FIG. 4 illustrates a gain transition controller suitable for use as a transition controller of FIG. 2 according to an embodiment.

FIG. 5 illustrates a transition setting circuit suitable for use as a transition setting circuit of FIG. 4 according to an embodiment.

FIG. 6 illustrates a transition signal generator suitable for use as a transition signal generator of FIG. 4 according to an embodiment.

FIG. 7 illustrates a reference feedback signal generator suitable for use as a reference feedback signal generator of FIG. 6 according to an embodiment.

DETAILED DESCRIPTION

Embodiments relate to power converters and controlling a startup operation. In an embodiment, a power converter receives an input voltage and provides an output voltage to a load. First gain control signal and a second gain control signal are generated in response to a gain transition signal, where the gain transition signal indicates a transition of the power converter from a first gain mode to a second gain mode. The power converter enters the first gain mode in response to the first gain control signal. The power converter enters the second gain mode in response to the second gain control signal.

Figure 1:
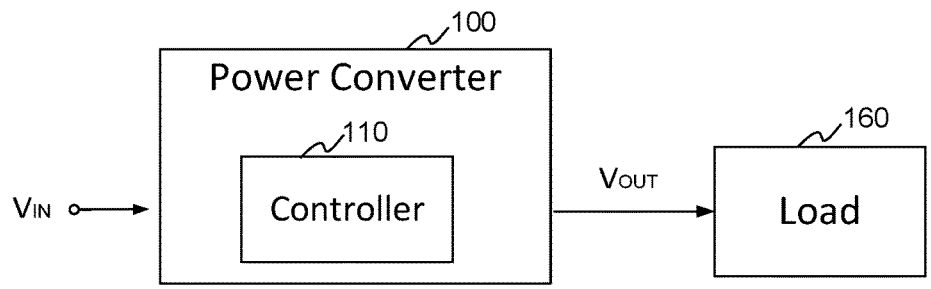
FIG. 1 illustrates a block diagram of a power converter according to an embodiment.

FIG. 1 illustrates a power converter 100 according to an embodiment. The power converter 100 receives an input voltage $V_{IN}$ and provides an output voltage $V_{OUT}$ to a load 160.

The power converter 100 in FIG. 1 includes a primary side controller 110. The primary side controller 110 in FIG. 1 may be integrated in a semiconductor chip, and the semiconductor chip may be packaged by itself or together with one or more other semiconductor chips.

The load 160 in FIG. 1 may include one or more integrated chips (ICs). In an embodiment, the output voltage $V_{out}$ is used to supply power to a Central Processing Unit (CPU), a Graphics Processing Unit (GPU), an integrated memory circuit, a battery charger, a light emitting diode (LED), or other types of electrical load.

Figure 2:
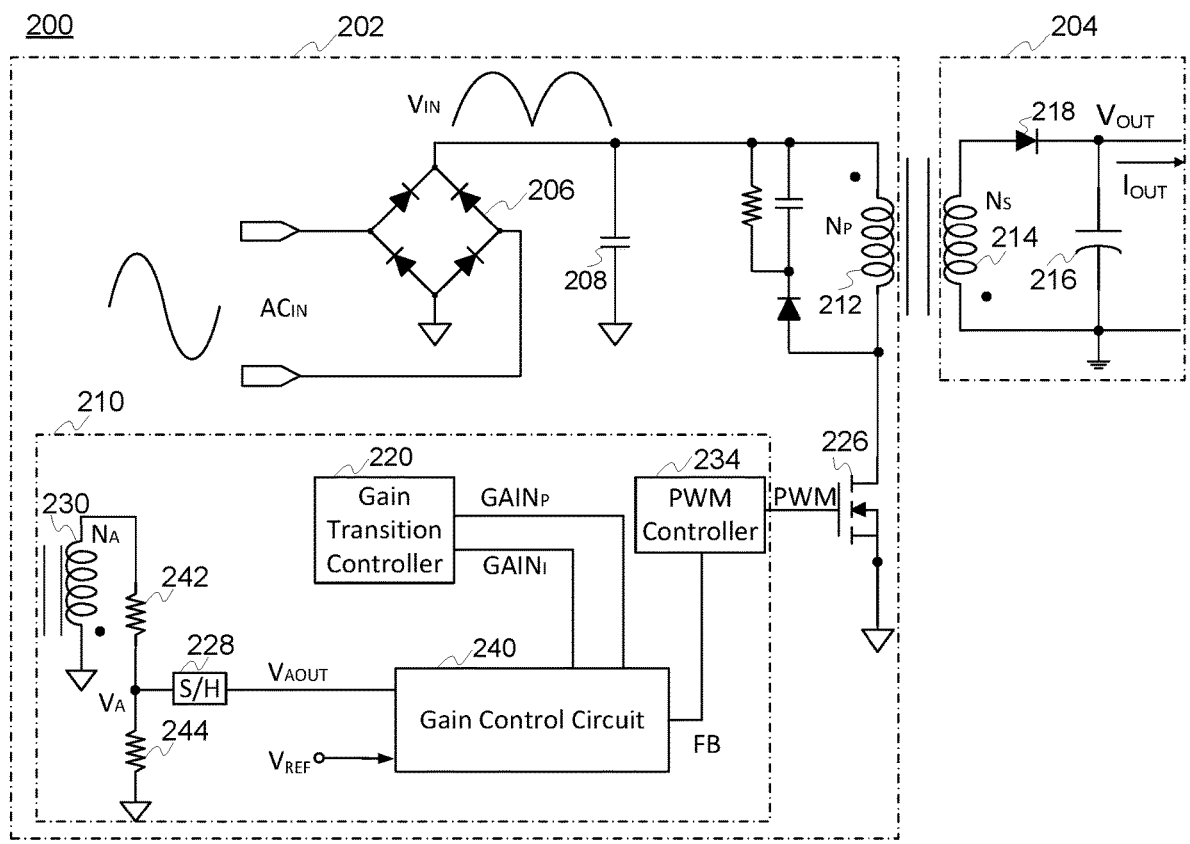
FIG. 2 illustrates a power converter suitable for use as the power converter of FIG. 1 according to an embodiment.

FIG. 2 illustrates a power converter 200 suitable for use as the power converter 100 of FIG. 1. The power converter 200 includes a primary side circuit 202 and a secondary side circuit 204.

The primary side circuit 202 in FIG. 2 includes a bridge rectifier 206, a capacitor 208, a primary winding 212, a switching device 226, and a controller 210. In an embodiment, the controller 210 in FIG. 2 is a primary side controller. A power supply (not shown) provides an AC input signal $AC_{IN}$ to the bridge rectifier 206, which inverts the negative halves of the received AC signal to generate a rectified AC signal (or an input voltage) $V_{IN}$. The input voltage $V_{IN}$ is applied to the primary winding 212 of the power converter 200.

The primary side controller 210 in FIG. 2 includes an auxiliary winding 230, first and second resistors 242 and 244, a sample-and-hold (S/H) circuit 228, a gain control circuit 240, a gain transition controller 220, and a pulse width modulation (PWM) controller (or a modulation controller) 234. The primary side controller 210 in FIG. 2 generates a PWM signal (or a modulation signal) PWM to control (e.g., turn on or off) a switching device 226.

When the switching device 226 in FIG. 2 is turned on, a first current flowing through the switching device 226 increases from zero to a peak value and energy is stored in the primary winding 212. When the switching device 226 is turned off, the stored energy causes a diode 218 in the secondary side circuit 204 to be turned on, resulting in a second current flowing through the diode 218. During a diode conduction period, a sum of an output voltage $V_{OUT}$ and a diode forward-voltage drop is reflected to the auxiliary winding 230 and a magnitude of the second current decreases. Because the diode forward-voltage drop decreases as the second current decreases, the reflected voltage $V_{NA}$ across the auxiliary winding 230 at a time proximate to the end of the diode conduction period can be represented by Equation 1:

$$V_{NA} \approx V_{OUT} \times \frac{N_A}{N_S}. \quad \text{Equation 1}$$

In Equation 1, $N_A$ is a number of turns of the auxiliary winding 230 and $N_S$ is a number of turns of the secondary winding 214.

The first and second resistors 242 and 244 in FIG. 2 function as a voltage divider and generate a divided voltage $V_A$ at a node between the first and second resistors 242 and 244. The S/H circuit 228 in FIG. 2 samples the divided voltage $V_A$ at the time proximate to the end of the diode conduction time, and thus a tracking signal (e.g., a tracking voltage) $V_{AOUT}$ corresponding to the sampled voltage has a level proportional to the output voltage $V_{OUT}$. In an embodiment, the S/H circuit 228 samples the divided voltage $V_A$ at the time corresponding to 70%, 85%, or 90% of the diode conduction time at a previous switching cycle. Although the embodiment shown in FIG. 2 includes the S/H circuit 228 to sample the divided voltage $V_A$ at a specific time to generate the sampled voltage $V_{AOUT}$, embodiments of the present disclosure are not limited thereto. In an embodiment, the S/H circuit 228 may be omitted, and the divided voltage $V_A$ can be used as the tracking signal $V_{AOUT}$ to continuously track the output voltage $V_{OUT}$. In another embodiment, the auxiliary winding 230 may be further omitted, and a scaled version of the output voltage $V_{OUT}$ can be used as the tracking signal $V_{AOUT}$.

The gain control circuit 240 in FIG. 2 receives the sampled voltage $V_{AOUT}$, a reference voltage $V_{REF}$, a first gain control signal (e.g., a proportional gain control signal) $GAIN_P$, and a second gain control signal (e.g., an integral gain control signal) $GAIN_I$, and generates a feedback signal FB in response to the received signals $V_{AOUT}$, $V_{REF}$, $GAIN_P$, and $GAIN_I$. In an embodiment, the first gain control signal $GAIN_P$ having a first logic value (e.g., a logic high value) indicates that the power converter 200 in FIG. 2 is operating with a proportional gain, and the second gain control signal $GAIN_I$ having a first logic value (e.g., a logic high value) indicates that the power converter 200 is operating with an integral gain.

Figure 8:
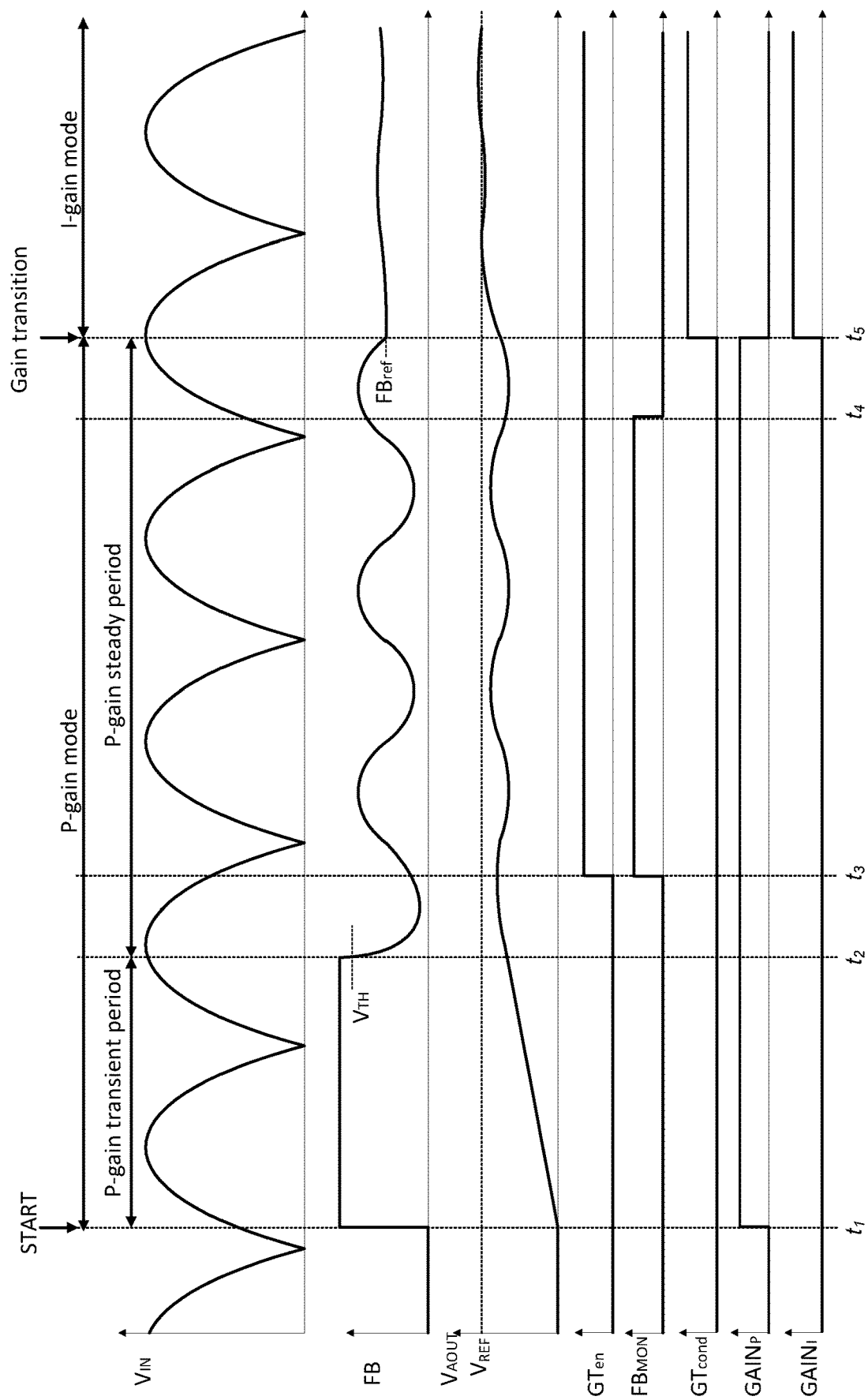
FIG. 8 illustrates example waveforms of an input voltage, a feedback signal, a sampled voltage, a transition setting signal, a feedback monitoring, a gain transition signal, a first gain control signal, and a second gain control signal.

When the power converter 200 in FIG. 2 is operating in a first gain mode (e.g., a proportional gain mode of FIG. 8) in response to the first gain control signal $GAIN_P$, the output voltage $V_{OUT}$ increases at a relatively high rate for a first time period (e.g., a proportional gain transient period of FIG. 8) and then is settled to a steady-state value for a second time period (e.g., a proportional gain stead period of FIG. 8). Subsequently, the power converter 200 transitions from the first gain mode to a second gain mode (e.g., an integral gain mode of FIG. 8) in response to the second gain control signal $GAIN_P$, and generates the output voltage $V_{OUT}$ having a relatively low frequency and a relatively small amplitude.

The gain transition controller 220 in FIG. 2 provides the first gain control signal $GAIN_P$ and the second gain control signal $GAIN_I$ to the gain control circuit 240. In an embodiment, the gain transition controller 220 generates the second gain control signal $GAIN_I$ having a first logic value (e.g., a logic high value) and the first gain control signal $GAIN_P$ having a second logic value (e.g., a logic low value) in response to a transition setting signal, a gain transition signal, and a feedback monitoring signal when a value of the feedback signal FB becomes less than a reference value. In another embodiment, the gain transition controller 220 generates the second gain control signal $GAIN_I$ having a first logic value (e.g., a logic high value) and the first gain control signal $GAIN_P$ having a second logic value (e.g., a logic low value) in response to the transition setting signal and the gain transition signal when the input voltage $V_{IN}$ reaches a peak value.

The PWM controller 234 in FIG. 2 receives the feedback signal FB from the gain control circuit 240, and generates the PWM signal in response to the feedback signal FB. In an embodiment, the PWM controller 234 reduces one or both of an on-time duration and a switching frequency of the PWM signal PWM when the value of the feedback signal FB is decreased, and the PWM controller 234 increases one or both of the on-time duration and the switching frequency of the PWM signal PWM when the value of the feedback signal FB is increased.

FIG. 3A illustrates a gain control circuit 340a suitable for use as the gain control circuit 240 of FIG. 2 according to an embodiment. The gain control circuit 340a in FIG. 3A includes an amplifier 302, first and second resistors 306 and 308, first and second switching devices 304 and 312, a capacitor 310, and an output node OTN.

The amplifier 302 in FIG. 3A generates a feedback signal FB in response to a sampled signal (e.g., a sampled voltage) $V_{AOUT}$ and a reference signal (e.g., a reference voltage) $V_{REF}$. In an embodiment, the amplifier 302 is a transconductance amplifier, which generates a current having a magnitude proportional to a difference between the sampled voltage $V_{AOUT}$ and the reference voltage $V_{REF}$.

In a first gain mode (e.g., a proportional gain mode), the first switching device 304 in FIG. 3A is turned on to couple the output node OTN to the first resistor 306 and the second resistor 308 in response to a first gain control signal $GAIN_P$, and the second switching device 312 is turned off in response to the second gain control signal $GAIN_I$. In an embodiment, the first switching device 304 in FIG. 3A is turned on when the first gain control signal $GAIN_P$ has a first logic value (e.g., a logic high value), and the second switching device 312 is turned off in response to the second gain control signal $GAIN_I$ having a second logic value (e.g., a low logic value).

The first resistor 306 has a first end connected to the first switching device 304 and a second end connected to a ground. When the gain control circuit 340a in FIG. 3A is operating in the first gain mode, a value of the feedback signal FB is determined dominantly by the resistance value of the first register 306.

The second resistor 308 has a first end connected to the output node OTN and a second end connected to the capacitor 310. When the gain control circuit 340a in FIG. 3A is operating in the first gain mode, the second resistor 308 and the capacitor 310 function as a low-pass filter.

In a second gain mode (e.g., an integral gain mode), the first switching device 304 in FIG. 3A is turned off in response to the first gain control signal $GAIN_P$, and the second switching device 312 in FIG. 3A is turned on to couple the output node OTN to a first end of the capacitor 310 in response to the second gain control signal $GAIN_I$. In an embodiment, the first switching device 304 in FIG. 3A is turned off when the first gain control signal $GAIN_P$ has a logic low value, and the second switching device 312 is turned on in response to the second gain control signal $GAIN_I$ having a logic high value.

A second end of the capacitor 310 in FIG. 3A is connected to a ground. When the gain control circuit 340a in FIG. 3A is operating in the second gain mode, the gain control circuit 340a outputs the feedback signal FB at the output node OTN coupled to the first end of the capacitor 310.

FIG. 3B illustrates a gain control circuit 340b suitable for use as the gain control circuit 240 of FIG. 2 according to another embodiment. The gain control circuit 340b in FIG. 3B includes an amplifier 312, a resistors 316, first, second, and third switching devices 314, 322, and 326, a buffer 318, a capacitor 324, and an output node OTN.

The amplifier 312 in FIG. 3B generates a feedback signal FB in response to a sampled signal (e.g., a sampled voltage) $V_{AOUT}$ and a reference signal (e.g., a reference voltage) $V_{REF}$. In an embodiment, the amplifier 312 is a transconductance amplifier, which generates a current having a magnitude proportional to a difference between the sampled voltage $V_{AOUT}$ and the reference voltage $V_{REF}$.

In a first gain mode (e.g., a proportional gain mode), the first switching devices 314 in FIG. 3B is turned on to couple the output node OTN to a first end of the resistor 316 in response to a first gain control signal $GAIN_P$, and the second switching device 322 in FIG. 3B is turned on to couple an output of the buffer 318 to a first end of the capacitor 324 in response to the first gain control signal $GAIN_P$. The third switching device 326 in FIG. 3B is turned off in response to a second gain control signal $GAIN_I$. In an embodiment, the first and second switching devices 314 and 322 in FIG. 3B are turned on when the first gain control signal $GAIN_P$ has a first logic value (e.g., a logic high value), and the third switching device 326 is turned off in response to the second gain control signal $GAIN_I$ having a second logic value (e.g., a low logic value).

When the gain control circuit 340b in FIG. 3B is operating in the first gain mode, a value of the feedback signal FB is determined by the value of a resistance value of the resistor 316. The buffer 318 in FIG. 3B, which has a non-inverting input receiving the feedback signal FB, makes a voltage level at the first end of the capacitor 324 substantially equal to the value of the feedback signal FB.

In a second gain mode (e.g., an integral gain mode), the first and second switching devices 314 and 322 in FIG. 3B are turned off in response to the first gain control signal $GAIN_P$, and the third switching device 326 in FIG. 3B is turned on to couple the output node OTN to the first end of the capacitor 310 in response to the second gain control signal $GAIN_I$. In an embodiment, the first and second switching devices 314 and 322 in FIG. 3B are turned off when the first gain control signal $GAIN_P$ has a logic low value, and the third switching device 326 in FIG. 3B is turned on in response to the second gain control signal $GAIN_I$ having a logic high value.

A second end of the capacitor 324 in FIG. 3B is connected to a ground. When the gain control circuit 340b in FIG. 3B is operating in the second gain mode, the gain control circuit 340b outputs the feedback signal FB at the output node OTN coupled to the first end of the capacitor 324.

FIG. 4 illustrates a gain transition controller 420 suitable for use as the transition controller 220 of FIG. 2 according to an embodiment.

The gain transition controller 420 in FIG. 4 generates first and second gain control signals $GAIN_P$ and $GAIN_I$, and provides the generated signals $GAIN_P$ and $GAIN_I$ to a gain control circuit (e.g., the gain control circuit 240 of FIG. 2). The gain transition controller 420 includes a transition signal generator 440, a transition setting circuit 460, a gain control signal generator 464, a monitoring signal generator 462, and an inverter 444.

The transition signal generator 440 in FIG. 4 generates a gain transition signal $GT_{cond}$. In an embodiment, the transition signal generator 440 receives one or more of a feedback signal (e.g., the feedback signal FB of FIG. 2), a reference feedback signal (e.g., a reference feedback signal $FB_{ref}$ of FIG. 6), an input voltage (e.g., the input voltage $V_{IN}$ of FIG. 2), a reference input voltage (e.g., a reference input voltage $V_{INREF}$ of FIG. 9C), and generates the gain transition signal $GT_{cond}$ in response to the received one or more signals.

The transition setting circuit 460 in FIG. 4 generates a transition setting signal $GT_{en}$ having a specific logic value (e.g., a logic high value), which indicates a transition from a first gain mode to a second gain mode. In an embodiment, the transition setting circuit 460 receives the feedback signal (e.g., a feedback signal FB of FIG. 5) and a threshold signal (e.g., a threshold signal $V_{TH}$ of FIG. 5), and generates the transition setting signal $GT_{en}$ having a logic high value in response to the feedback signal and the threshold signal. In another embodiment, the transition setting circuit 460 receives a signal (e.g., a signal START of FIG. 10) indicating initiation of a startup operation of a power converter at a first time, delays the received signal by a given delay amount, and generates the transition setting signal $GT_{en}$ having a logic high value at a second time corresponding to a sum of the first time and the given delay amount. The given delay amount is a predetermined amount in an embodiment.

The monitoring signal generator 462 in FIG. 4 includes a delay circuit 452 and a flip-flop 454. The delay circuit 452 receives the transition setting signal $GT_{en}$ and generates a delayed version of the transition setting signal $GT_{en}$ by a given delay amount, where the given delay amount is a predetermined delay amount. The flip-flop 454 receives the transition setting signal $GT_{en}$ and generates a feedback monitoring signal $FB_{MON}$ in response to the transition setting signal $GT_{en}$ and the delayed version of the transition setting signal $GT_{en}$.

In an embodiment, the flip-flop 454 in FIG. 4 is a set/reset (RS) flip-flop. The RS flip-flop 454 receives the transition setting signal $GT_{en}$ as a set signal and the delayed version of the transition setting signal $GT_{en}$ as a reset signal, and generates the feedback monitoring signal $FB_{MON}$ having an on-time duration that corresponds to the delay amount of the delay circuit 452.

The gain control signal generator 464 in FIG. 4 includes first and second logic gates 442 and 450. The first logic gate 442 receives the transition setting signal $GT_{en}$ and an inverted version of the feedback monitoring signal $FB_{MON}$. In an embodiment, the first logic gate 442 is an AND gate and performs an AND logical operation on the transition setting signal $GT_{en}$ and the inverted version of the feedback monitoring signal $FB_{MON}$.

The second logic gate 450 in FIG. 4 receives the gain transition signal $GT_{cond}$ and an output signal from the first logic gate 442, and generates the second gain control signal GAIN$_I$. In an embodiment, the second logic gate 450 is an AND gate and performs an AND logical operation on the gain transition signal GT$_{cond}$ and the output signal from the first logic gate 442.

The inverter 444 receives the second gain control signal GAIN$_I$ and generates an inverted version of the second gain control signal GAIN$_I$, which corresponds to the first gain control signal GAIN$_P$.

Although the embodiment shown in FIG. 4 includes the monitoring signal generator 462 generating the feedback monitoring signal FB$_{MON}$, embodiments of the present disclosure are not limited thereto. In another embodiment, the monitoring signal generator 462 generating the feedback monitoring signal FB$_{MON}$ and the first logic gate 442 receiving the feedback monitoring signal FB$_{MON}$ may be omitted, and thus the second logic gate 450 receives the transition setting signal GT$_{en}$ instead of the output signal from the first logic gate 442.

FIG. 5 illustrates a transition setting circuit 560 suitable for use as the transition setting circuit 460 of FIG. 4 according to an embodiment. The transition setting circuit 560 of FIG. 5 includes a comparator 566 and a delay circuit 564.

The comparator 566 in FIG. 5 compares a feedback signal FB to a threshold signal V$_{TH}$, and generates an output signal in response to the feedback signal FB and the threshold signal V$_{TH}$. In an embodiment, the comparator 566 generates the output signal having a first logic value (e.g., a logic high value) when a value of the feedback signal FB becomes less than a value of the threshold signal V$_{TH}$, and generates the output signal having a second logic value (e.g., a logic low value) when a value of the feedback signal FB becomes greater than a value of the threshold signal V$_{TH}$.

The delay circuit 564 in FIG. 5 delays the output signal of the comparator 566 by a given delay amount to generate a transition setting signal GT$_{en}$, where the given delay amount may be a predetermined amount. In an embodiment, the predetermined amount of the delay circuit 566 corresponds to a time interval between the first time (e.g., a second time t$_2$ in FIG. 8) when the value of the feedback signal FB becomes less than the value of the threshold signal V$_{TH}$ and a second time (e.g., a third time t$_3$ in FIG. 8) when the transition setting signal GT$_{en}$ is asserted to have a logic high value. Although the embodiment in FIG. 5 includes the delay circuit 566, embodiments of the present disclosure are not limited thereto. In an embodiment, the delay circuit 566 can be omitted and the output signal of the comparator 566 in FIG. 5 can be used as the transition setting signal GT$_{en}$.

FIG. 6 illustrates a transition signal generator 640 suitable for use as the transition signal generator 440 of FIG. 4 according to an embodiment. The transition signal generator 640 in FIG. 6 includes a reference feedback signal generator 642, a comparator 644, and an edge trigger 646.

The reference feedback signal generator 642 in FIG. 6 receives a feedback signal FB and generates a reference feedback signal FB$_{ref}$ in response to the feedback signal FB. In an embodiment, the reference feedback signal FB$_{ref}$ has an average value of the feedback signal FB over a given time interval, where the given time interval may be a predetermined time interval.

The comparator 644 in FIG. 6 compares the value of the reference feedback signal FB$_{ref}$ and an instantaneous value of the feedback signal FB and generates an output signal in response to the comparison result. In an embodiment, comparator 664 generates the output signal transitioning from a first logic value (e.g., a logic high value) to a second logic value (e.g., a logic low value) when the instantaneous value of the feedback signal FB becomes less than the value of the reference feedback signal FB$_{ref}$.

The edge trigger 646 in FIG. 6 generates a gain transition signal GT$_{cond}$ in response to the output signal from the comparator 644. In an embodiment, the edge trigger 646 generates the gain transition signal GT$_{cond}$ having a logic high value in response to an edge (e.g., a falling edge or a rising edge) of the output signal from the comparator 644.

FIG. 7 illustrates a reference feedback signal generator 742 suitable for use as the reference feedback signal generator 642 of FIG. 6 according to an embodiment. The reference feedback signal generator 742 in FIG. 7 includes a switching device 738, a peak detector 744, a valley detector 764, an adder 748, and a multiplier 750.

The switching device 738 in FIG. 7 is turned on or off in response to a feedback monitoring signal FB$_{MON}$. In an embodiment, the switching device 738 is turned on to transmit a feedback signal FB to the peak detector 744 and the valley detector 746 when the feedback monitoring signal FB$_{MON}$ has a first logic value (e.g., a logic high value).

The peak detector 744 in FIG. 7 detects a maximum value of the feedback signal FB when the feedback signal FB has a logic high value. The peak detector 744 outputs a signal indicating the maximum value to the adder 748.

The valley detector 738 in FIG. 7 detects a minimum value of the feedback signal FB when the feedback signal FB has a logic high value. The valley detector 738 outputs a signal indicating the minimum value to the adder 748.

The adder 748 in FIG. 7 adds the maximum value and the minimum value, and output a signal indicating the added value to the multiplier 750.

The multiplier 750 in FIG. 7 multiplies the added value with a predetermined value, and outputs a signal indicating the multiplied value as a reference feedback FB$_{ref}$. In an embodiment, the multiplier 750 multiplies the added value with the predetermined value of 0.5, and thus the multiplied value corresponds to an averaged value of the feedback signal FB during a time interval when the feedback monitoring signal FB$_{MON}$ has a logic high value.

An operation of a primary side controller (e.g., the primary side controller 210 in FIG. 2), which includes the transition setting circuit 560 in FIG. 5 and the transition signal generator 640 in FIG. 6, is explained below in more detail below with reference to FIG. 8. FIG. 8 illustrates example waveforms of an input voltage (e.g., the input voltage V$_{IN}$ in FIG. 2), the feedback signal FB, the sampled voltage V$_{AOUT}$, the transition setting signal GT$_{en}$, the feedback monitoring FB$_{MON}$, the gain transition signal GT$_{cond}$, the first gain control signal GAIN$_P$, and the second gain control signal GAIN$_I$.

At a first time t$_1$ in FIG. 8, a power converter (e.g., the power converter 200 of FIG. 2) enters a first gain mode (e.g., a proportional gain mode). Because a difference between the sampled voltage V$_{AOUT}$ and a reference voltage V$_{REF}$ (e.g., the reference voltage V$_{REF}$ in FIG. 3A) is relatively large, an amplifier (e.g., the amplifier 302 in FIG. 3A) generates a current having a magnitude sufficiently large to pull up the value of the feedback signal FB to a maximum value.

A time interval in the proportional gain mode in FIG. 8 includes a transient period (e.g., a proportional gain transient period) and a steady state period (e.g., a proportional gain steady period). During the proportional gain transient period between the first time t$_1$ and a second time t$_2$, the feedback signal FB has the maximum value, leading to a maximum duty cycle of a PWM signal (e.g., the PWM signal PWM in FIG. 2). As a result, the sampled voltage V$_{AOUT}$ in FIG. 8 indicating an output voltage (e.g., the output voltage $V_{OUT}$ in FIG. 2) increases at a relatively fast rate, leading to a fast startup operation.

At the second time $t_2$ in FIG. 8 when the sampled voltage $V_{AOUT}$ reaches a predetermined level (e.g., 95% of the reference voltage $V_{REF}$), the difference between the sampled voltage $V_{AOUT}$ and the reference voltage $V_{REF}$ becomes sufficiently small to decrease the value of the feedback signal FB from the maximum value to the value of the threshold signal $V_{TH}$. The power converter enters the proportional gain steady period during which the sampled voltage $V_{AOUT}$ is settled to a steady state value within a predetermined range. For example, the sampled voltage $V_{AOUT}$ is settled within a range from 95% to 105%, from 98% to 102%, or from 99% to 101% of the steady state value. The steady state value is lower than the reference voltage $V_{REF}$. For example, the stead state value is in a range from 96% to 99% of the level of the reference voltage $V_{REF}$.

During a time interval between the third time $t_3$ and a fourth time $t_4$ in FIG. 8, the flip-flop 454 in FIG. 4 generates the feedback monitoring signal $FB_{MON}$ having a first logic value (e.g., a logic high value) in response to the transition setting signal $GT_{en}$ and the delayed version of the transition setting signal $GT_{en}$. The delay amount of the delay circuit 452 in FIG. 4 corresponds to the time interval between the third time $t_3$ and the fourth time $t_4$ in FIG. 8.

During the time interval between the third time $t_3$ and the fourth time $t_4$ in FIG. 8 when the feedback monitoring signal $FB_{MON}$ having a logic high value, the reference feedback signal generator 642 in FIG. 6 generates the reference feedback signal $FB_{ref}$. In an embodiment, the reference feedback signal generator 742 in FIG. 7 generates the reference feedback signal $FB_{ref}$ having an averaged value of the feedback signal FB over the time interval between the third time $t_3$ and the fourth time $t_4$ in FIG. 8.

At the fourth time $t_4$ in FIG. 8, the delay circuit 452 in FIG. 4 provides an output signal having a logic high value as a reset signal to the flip-flop 454 in FIG. 4. As a result, the flip-flop 454 generates the feedback monitoring signal $FB_{MON}$ having a logic low value, and the first logic gate 442 in FIG. 4 generates an output signal having a logic high value in response to an inverted version of the feedback monitoring signal $FB_{MON}$ and the transition setting signal $GT_{en}$.

At a fifth time $t_5$ in FIG. 8, the feedback signal FB has a value less than the value of the reference feedback signal $FB_{ref}$, and the transition signal generator 640 in FIG. 6 generates the gain transition signal $GT_{cond}$ having a logic high value. Because the output signal of the first logic gate 442 in FIG. 4 has been asserted to have a logic high value since the fourth time $t_4$, the second logic gate 450 in FIG. 4 generates the second gain control signal $GAIN_I$ having a logic high value in response to the output signal of the first logic gate 442 and the gain transition signal $GT_{cond}$. The inverter 444 in FIG. 4 inverts the second gain control signal $GAIN_I$ having a logic high value to generate the first gain control signal $GAIN_P$ having a logic low value. As a result, the power converter enters an integral gain mode at the fifth time $t_5$.

Although the power converter according to the embodiment shown in FIG. 8, which includes the transition signal generator 640 in FIG. 6, enters the integral gain mode at the fifth time $t_5$ when the feedback signal FB has a value less than the value of the reference feedback signal $FB_{ref}$, embodiments of the present disclosure are not limited thereto. FIGS. 9A to 9E illustrate respective transition signal generators 940a to 940e according to various embodiments.

Figure 9A:
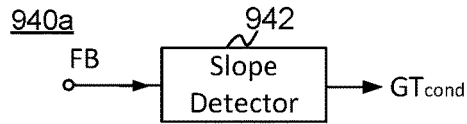
FIG. 9A illustrates a transition signal generator suitable for use as the transition signal generator of FIG. 4 according to an embodiment.

FIG. 9A illustrates the transition signal generator 940a suitable for use as the transition signal generator 440 of FIG. 4 according to an embodiment. The transition signal generator 940a in FIG. 9A includes a slope detector 942.

The slope detector 942 in FIG. 9A receives a feedback signal FB and generates a signal indicating a slope of the feedback signal FB. In an embodiment, the slope detector 942 generates a gain transition signal $GT_{cond}$ having a first logic value (e.g., a logic high value) at a time when the signal indicating the slope of the feedback signal FB has a value equal to or less than a predetermined value.

Figure 9B:
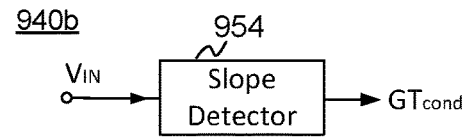
FIG. 9B illustrates a transition signal generator suitable for use as the transition signal generator of FIG. 4 according to an embodiment.

FIG. 9B illustrates the transition signal generator 940b suitable for use as the transition signal generator 440 of FIG. 4 according to an embodiment. The transition signal generator 940b in FIG. 9B includes a slope detector 954.

The slope detector 954 in FIG. 9B receives an input voltage $V_{IN}$ (e.g., the input voltage $V_{IN}$ of FIG. 2) and generates a signal indicating a slope of the input voltage $V_{IN}$. The slope detector 954 generates a gain transition signal $GT_{cond}$ having a first logic value (e.g., a logic high value) at a time when the signal indicating slope of the input voltage $V_{IN}$ has a value equal to or less than a predetermined value.

Figure 9C:
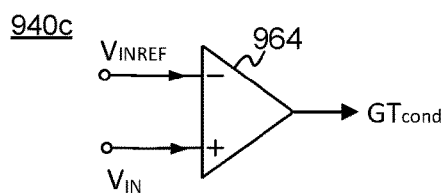
FIG. 9C illustrates a transition signal generator suitable for use as the transition signal generator of FIG. 4 according to an embodiment.

FIG. 9C illustrates the transition signal generator 940c suitable for use as the transition signal generator 440 of FIG. 4 according to an embodiment. The transition signal generator 940c in FIG. 9C includes a comparator 964.

The comparator 964 in FIG. 9C compares an input voltage $V_{IN}$ and a reference input signal (e.g., a reference input voltage) $V_{INREF}$. The comparator 964 generates a gain transition signal $GT_{cond}$ having a first logic value (e.g., a logic high value) at a time when the input $V_{IN}$ has a level equal to or higher than a level of the reference input voltage $V_{INREF}$.

Figure 9D:
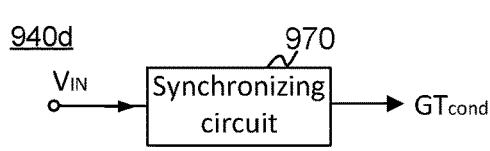
FIG. 9D illustrates a transition signal generator suitable for use as the transition signal generator of FIG. 4 according to an embodiment.

FIG. 9D illustrates the transition signal generator 940d suitable for use as the transition signal generator 440 of FIG. 4 according to an embodiment. The transition signal generator 940d in FIG. 9D includes a synchronizing circuit 970.

The synchronizing circuit 970 in FIG. 9D synchronizes a gain transition signal $GT_{cond}$ with an input voltage $V_{IN}$. In an embodiment, the synchronizing circuit 970 continuously detects the input voltage $V_{IN}$ (e.g., the input voltage $V_{IN}$ of FIG. 2) and generates the gain transition signal $GT_{cond}$ having a first logic value (e.g., a logic high value) at a time when the detected input voltage $V_{IN}$ has a maximum value. In another embodiment, the synchronizing circuit 970 generates the gain transition signal $GT_{cond}$ having a logic high value at a time when the input voltage $V_{IN}$ has a value substantially equal to zero.

Figure 9E:
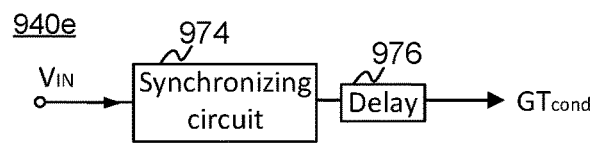
FIG. 9E illustrates a transition signal generator suitable for use as the transition signal generator of FIG. 4 according to an embodiment.

FIG. 9E illustrates the transition signal generator 940e suitable for use as the transition signal generator 440 of FIG. 4 according to an embodiment. The transition signal generator 940e in FIG. 9E includes a synchronizing circuit 974 and a delay circuit 976.

The synchronizing circuit 974 in FIG. 9E synchronizes a gain transition signal $GT_{cond}$ with an input voltage $V_{IN}$. In an embodiment, the synchronizing circuit 974 has substantially the same configuration as the synchronizing circuit 970 in FIG. 9D, and generates an output signal having a first logic value (e.g., a logic high value) at a first time when the input voltage $V_{IN}$ has a maximum value.

The delay circuit 976 in FIG. 9E delays the output signal of the synchronizing circuit 974 by a given delay amount to generate a gain transition signal $GT_{cond}$ having a first logic value (e.g., a logic high value) at a second time corresponding to a sum of the first time and the given delay amount, where the given delay amount is a predetermined amount. In an embodiment, the delay amount of the delay circuit 976 is determined such that a feedback signal (e.g., the feedback signal FB of FIG. 2) has a minimum value at the second time, thereby preventing a severe overshoot of an output voltage $V_{OUT}$ (e.g., the output voltage $V_{OUT}$ of FIG. 2) of a power converter (e.g., the power converter 200 of FIG. 2).

Figure 10:
FIG. 10 illustrates a transition setting circuit suitable for use as the transition setting circuit of FIG. 4 according to another embodiment.

FIG. 10 is a circuit diagram illustrating a transition setting circuit 1060 suitable for use as the transition setting circuit 460 of FIG. 4 according to another embodiment.

The transition setting circuit 1060 of FIG. 10 includes a delay circuit 1066. The delay circuit 1066 in FIG. 10 receives a signal (e.g., a signal START of FIG. 11) indicating initiation of a startup operation of a power converter (e.g., the power converter 200 of FIG. 2), and delays the received signal by a given delay amount to generate a transition setting signal $GT_{en}$, where the given delay amount may be a predetermined amount.

In an embodiment, the delay circuit 1066 in FIG. 10 receives the signal having a first logic value (e.g., a logic high value) at a first time and generates the transition setting signal $GT_{en}$ having a logic high value at a second time corresponding to a sum of the first time and the predetermined amount. For example, the predetermined amount of the delay circuit 1066 corresponds to a time interval between the first time (e.g., the first time $t_1$ in FIG. 11) when the power converter initiates the startup operation and the second time (e.g., the third time $t_3$ in FIG. 11) when the transition setting signal $GT_{en}$ is asserted to have a logic high value.

Figure 11:
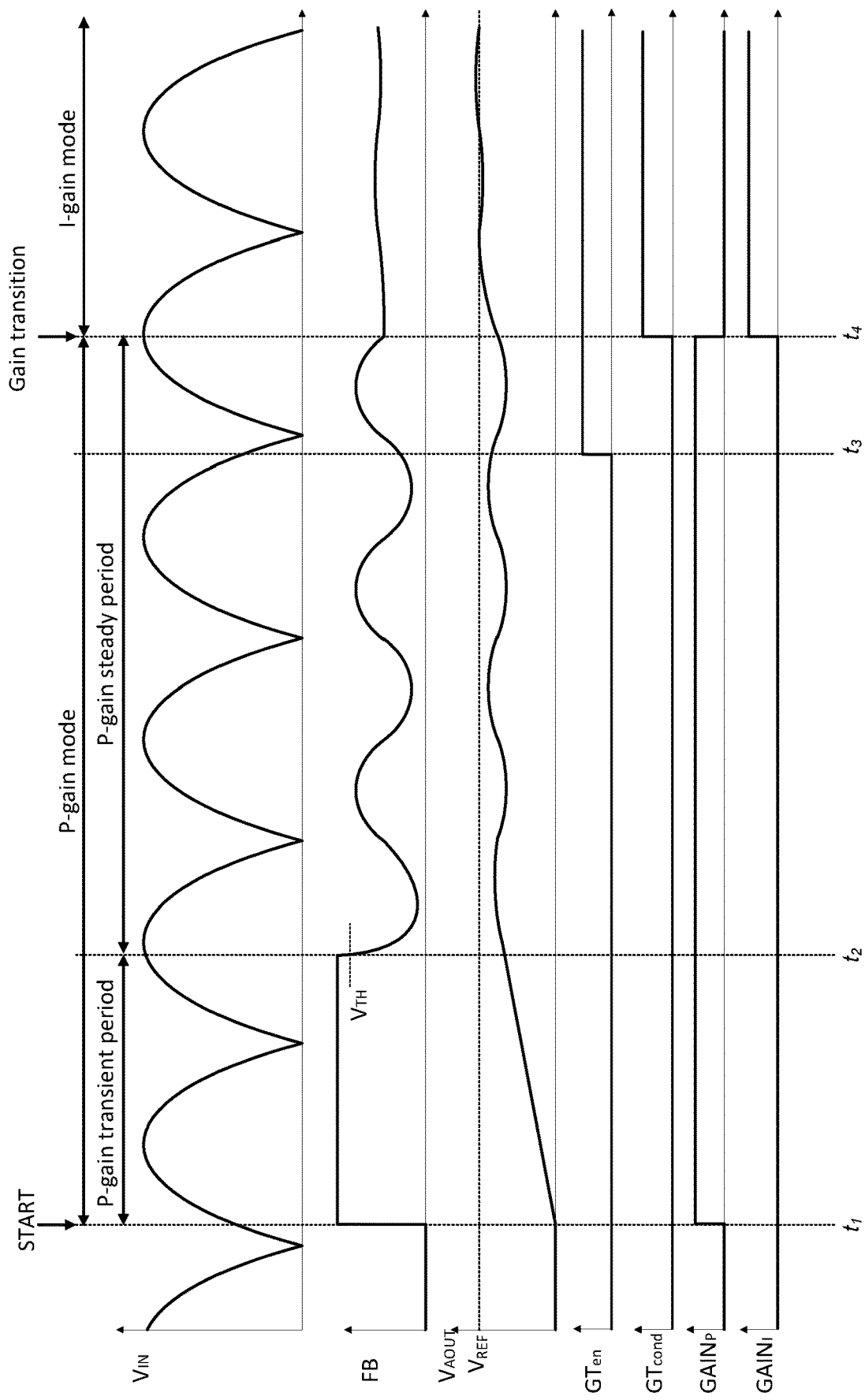
FIG. 11 illustrates example waveforms of an input voltage, a feedback signal, a sampled voltage, a transition setting signal, a gain transition signal, a first gain control signal, and the second gain control signal.

An operation of a primary side controller (e.g., the primary side controller 210 in FIG. 2), which includes the transition setting circuit 1060 in FIG. 10, is explained below in more detail below with reference to FIG. 11. FIG. 11 illustrates example waveforms of an input voltage $V_{IN}$ (e.g., the input voltage $V_{IN}$ in FIG. 2), the feedback signal FB, a sampled voltage $V_{AOUT}$, the transition setting signal $GT_{en}$, a gain transition signal $GT_{cond}$ (e.g., the gain transition signal $GT_{cond}$ of FIG. 4), a first gain control signal $GAIN_P$ (e.g., the first gain control signal $GAIN_P$ of FIG. 2), and a second gain control signal $GAIN_I$ (e.g., the second gain control signal $GAIN_I$ of FIG. 2).

At a first time $t_1$ in FIG. 11, a power converter (e.g., the power converter 200 of FIG. 2) receives a signal START indicating initiation of a startup operation and enters a first gain mode (e.g., a proportional gain mode). Because a difference between the sampled voltage $V_{AOUT}$ and a reference voltage (e.g., the reference voltage $V_{REF}$ in FIG. 3A) is relatively large, an amplifier (e.g., the amplifier 302 in FIG. 3A) generates a current having a magnitude sufficiently large to pull up the value of the feedback signal FB to a maximum value.

A time interval in the proportional gain mode in FIG. 11 includes a transient period (e.g., a proportional gain transient period) and a steady state period (e.g., a proportional gain steady period). During the proportional gain transient period between the first time $t_1$ and a second time $t_2$, the feedback signal FB has the maximum value, leading to a maximum duty cycle of a PWM signal (e.g., the PWM signal PWM in FIG. 2). As a result, the sampled voltage $V_{AOUT}$ in FIG. 11 indicating an output voltage (e.g., the output voltage $V_{OUT}$ in FIG. 2) increases at a relatively fast rate, leading to a fast startup operation.

At the second time $t_2$ in FIG. 11 when the sampled voltage $V_{AOUT}$ reaches a predetermined level (e.g., 95% of the reference voltage $V_{REF}$), the difference between the sampled voltage $V_{AOUT}$ and the reference voltage $V_{REF}$ becomes sufficiently small to decrease the value of the feedback signal FB from the maximum value to the value of the threshold signal $V_{TH}$. The power converter enters the proportional gain steady period during which the sampled voltage $V_{AOUT}$ is settled to a value lower than the reference voltage $V_{REF}$.

In an embodiment including the delay circuit 1066 in FIG. 10, the delay circuit 1066 receives the signal START indicating the initiation of the startup operation at the first time $t_1$ and generates the transition setting signal $GT_{en}$ having a logic high value at the third time $t_3$. Thus, a time interval between the first time $t_1$ and the third time $t_3$ in FIG. 11 corresponds to the delay amount of the delay circuit 1066 in FIG. 10.

Other operations of the primary side controller including the transition setting circuit 1060 in FIG. 10 are similar to those of the primary side controller including the transition setting circuit 560 in FIG. 5. Thus, detailed descriptions of these operations of the primary side controller including the transition setting circuit 1060 in FIG. 10 will be omitted herein for the interest of brevity.

Figure 12:
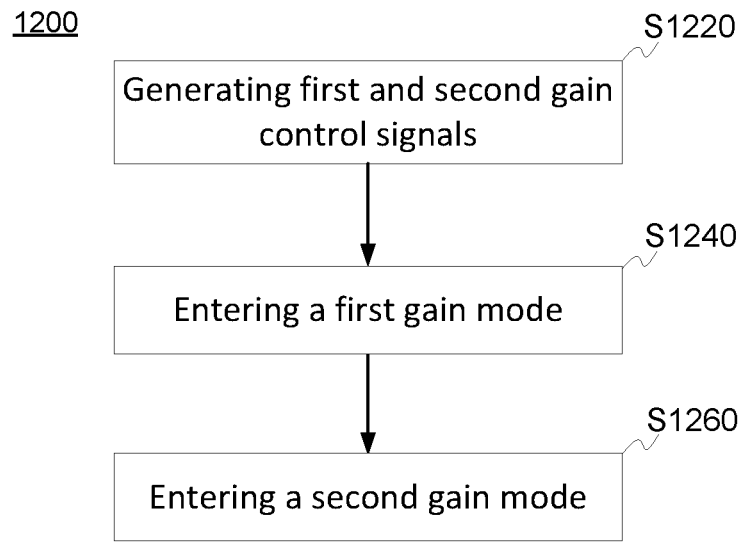
FIG. 12 illustrates a process performed by a controller of a power converter according to an embodiment.

FIG. 12 illustrates a process 1200 performed by a controller (e.g., the primary side controller 210 of FIG. 2) of a power converter (e.g., the power converter 200 of FIG. 2) according to an embodiment. The controller includes a gain transition controller (e.g., the gain transition controller 220 of FIG. 2), a gain control circuit (e.g., the gain control circuit 240 of FIG. 2), and a modulation controller (e.g., the PWM controller 234 of FIG. 2).

At S1220, the gain transition controller generates a first gain control signal and a second gain control signal in response to a gain transition signal, which indicates a transition of the power converter from a first gain mode to a second gain mode. In an embodiment, the first gain mode is a proportional gain mode and the second gain mode is an integral gain mode.

At S1240, the gain control circuit causes the power converter to enter the first gain mode in response to the first gain control signal. In an embodiment, the power converter enters the first gain mode in response to the first gain control signal having a first logic value (e.g., a logic high value).

At S1060, the gain control circuit causes the power converter to enter the second gain mode in response to the second gain control signal. In an embodiment, the power converter enters the second gain mode in response to the second gain control signal having a first logic value (a logic high value).

Figure 13:
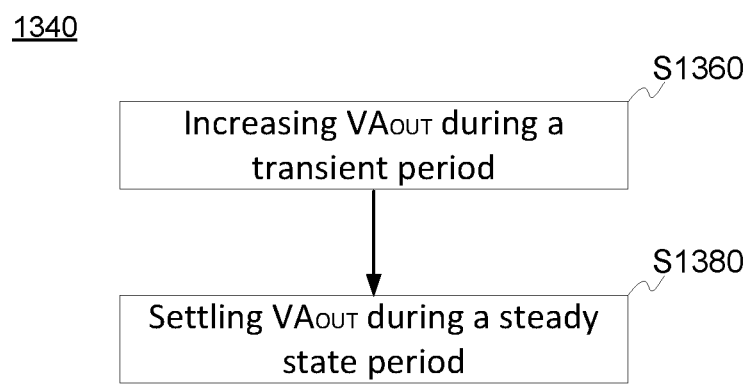
FIG. 13 illustrates a process performed by a controller when a power converter operates in a first gain mode according to an embodiment.

FIG. 13 illustrates a process 1340 performed by a controller (e.g., the primary side controller 210 of FIG. 2) including a gain control circuit (e.g., the gain control circuit 240 of FIG. 2) when a power converter (e.g., the power converter 200 of FIG. 2) operates in the first gain mode according to an embodiment. In an embodiment, the first gain mode is a proportional gain mode, and a time interval of the proportional gain mode includes a transient period and a stead state period.

At S1360, the gain control circuit increases a value of a tracking signal (e.g., the sampled signal $V_{AOUT}$ of FIG. 2) substantially linearly during the transient period (e.g., the proportional gain transient period of FIG. 8). The sampled signal indicates an output signal of the power converter.

At S1380, the gain control circuit causes the sampled signal to settle proximate to a specific value during the steady state period (e.g., the proportional gain steady period of FIG. 8). The specific value is smaller than a value of a reference signal (e.g., the reference signal $V_{REF}$ of FIG. 2).

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A method for controlling a power converter, the method comprising:
   generating a gain transition signal in response to any one of an average value of a feedback signal, a slope of the feedback signal, a slope of an input signal of the power converter, a maximum value of the input signal, and a minimum value of the input signal, the gain transition signal indicating a transition of the power converter from a first gain mode to a second gain mode, wherein a time interval in the first gain mode includes a transient period and a steady state period;
   generating a first gain control signal and a second gain control signal in response to the gain transition signal; and
   keeping a value of the feedback signal at a constant value during the transient period of the first gain mode.

2. The method of claim 1, wherein generating the gain transition signal comprises asserting the gain transition signal to have a specific logic value when the slope of the feedback signal is equal to or less than a given value.

3. The method of claim 1, wherein generating the gain transition signal comprises asserting the gain transition signal to have a specific logic value when the slope of the input signal is equal to or less than a given value.

4. The method of claim 1, further comprising synchronizing the gain transition signal with the input signal of the power converter.

5. The method of claim 4, wherein synchronizing the gain transition signal comprises:
   asserting an output signal at a first time when the input signal has a given value; and
   delaying the output signal by a given delay amount to assert the gain transition signal at a second time, the feedback signal having a minimum value at the second time.

6. The method of claim 1, the method further comprising generating the feedback signal in response to the first gain control signal and the second gain control signal, the power converter increasing a value of an output signal during the transient period of the first gain mode in response to the feedback signal.

7. The method of claim 1, wherein the first gain mode is a proportional gain mode and the second gain mode is an integral gain mode.

8. The method of claim 1, wherein the feedback signal is kept at a maximum value during the transient period of the first gain mode to lead to a maximum duty cycle of a modulation signal.

9. The method of claim 1, further comprising:
   reducing one or both of an on-time duration and a switching frequency of a modulation signal when a value of the feedback signal is decreased; and
   increasing one or both of the on-time duration and the switching frequency of the modulation signal when the value of the feedback signal is increased.

10. A controller for controlling a power converter comprising:
    a transition signal generator configured to generate a gain transition signal in response to any one of an average value of a feedback signal, a slope of the feedback signal, a slope of an input signal of the power converter, a maximum value of the input signal, and a minimum value of the input signal, the gain transition signal indicating a transition of the power converter from a first gain mode to a second gain mode;
    a gain control signal generator configured to generate a first gain control signal and a second gain control signal in response to the gain transition signal; and
    a gain control circuit generating the feedback signal in response to the first gain control signal and the second gain control signal,
    wherein a time interval in the first gain mode includes a transient period and a steady state period, and the gain control circuit keeps a value of the feedback signal at a constant value during the transient period of the proportional gain mode.

11. The controller of claim 10, wherein the transition signal generator includes a slope detector generating the gain transition signal having a specific logic value when the slope of the feedback signal is equal to or less than a given value.

12. The controller of claim 10, wherein the transition signal generator includes a slope detector generating the gain transition signal having a specific logic value when the slope of the input signal is equal to or less than a given value.

13. The controller of claim 10, wherein the transition signal generator includes:
    a synchronizing circuit asserting an output signal at a first time when the input signal has a maximum value during a cycle of the input signal; and
    a delay circuit delaying the output signal of the synchronizing circuit by a given delay amount to assert the gain transition signal at a second time when the feedback signal having a minimum value during a cycle of the feedback signal.

14. The controller of claim 10, wherein the power converter increases a value of an output signal during the transient period of the first gain mode in response to the feedback signal.

15. The controller of claim 14, wherein the gain control circuit includes:
    an amplifier generating the feedback signal in response to a tracking signal and a reference signal, the tracking signal indicating the output signal of the power converter;
    an output node outputting the feedback signal;
    a first switching device operating in response to the first gain control signal;
    a first resistor having a first end connected to the first switching device and a second end connected to a ground; and
    a second resistor having a first end connected to the output node and a second end connected to a first end of a capacitor.

16. The controller of claim 15, wherein the gain control circuit further includes a second switching device operating in response to the second gain control signal and being coupled to the second resistor in parallel, and wherein a second end of the capacitor is connected to the ground.

17. A power converter comprising:
    a gain transition controller configured to generate a first gain control signal and a second gain control signal in response to a gain transition signal, the gain transition signal indicating a transition of the power converter from a proportional gain mode to an integral gain mode, a time interval in the proportional gain mode including a transient period and a steady state period;
    a gain control circuit configured to generate a feedback signal in response to the first gain control signal and the second gain control signal, the power converter increasing a value of an output signal during the transient period of the proportional gain mode in response to the feedback signal; and a modulation controller configured to generate a modulation signal in response to the feedback signal, wherein the gain control circuit keeps a value of the feedback signal at a constant value during the transient period of the proportional gain mode.

18. The converter of claim 17, wherein the modulation controller reduces one or both of an on-time duration and a switching frequency of the modulation signal when a value of the feedback signal is decreased, and wherein the modulation controller increases one or both of the on-time duration and the switching frequency of the modulation signal when the value of the feedback signal is increased.

19. The controller of claim 10, wherein the transition signal generator asserts the gain transition signal when the feedback signal has a minimum value during a cycle of the feedback signal.

20. The controller of claim 10, wherein the first gain mode is a proportional gain mode and the second gain mode is an integral gain mode, and wherein an output signal of the power converter oscillates with a first magnitude and a first frequency in the proportional gain mode and the output signal with a second magnitude and a second frequency in the integral gain mode, the second magnitude being smaller than the first magnitude, the second frequency being lower than the first frequency.

* * * * *